United States Patent
Sekikawa et al.

(10) Patent No.: US 7,614,272 B2
(45) Date of Patent: Nov. 10, 2009

(54) PRESPRAY PROCESSING METHOD AND PRESPRAY PROCESSED ENGINE CYLINDER BLOCK

(75) Inventors: Takashi Sekikawa, Yokohama (JP); Masahiko Iizumi, Fujisawa (JP); Takashi Ogino, Yokohama (JP); Kimio Nishimura, Yokohama (JP); Eiji Shiotani, Kawasaki (JP); Hideo Takahashi, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 195 days.

(21) Appl. No.: 11/228,011

(22) Filed: Sep. 16, 2005

(65) Prior Publication Data

US 2006/0063021 A1 Mar. 23, 2006

(30) Foreign Application Priority Data

Sep. 17, 2004 (JP) ............................. 2004-271743

(51) Int. Cl.
C23C 4/02 (2006.01)
B05D 3/12 (2006.01)
B21D 13/02 (2006.01)
B21D 13/04 (2006.01)
B23P 9/02 (2006.01)

(52) U.S. Cl. .................... 72/214; 72/199; 72/252.5; 29/423; 29/557; 427/299; 427/327; 118/44; 118/72

(58) Field of Classification Search .................. None
See application file for complete search history.

(56) References Cited

U.S. PATENT DOCUMENTS

| 2,320,329 | A | | 5/1943 | Meduna |
| 5,622,753 | A | | 4/1997 | Shepley et al. |
| 5,918,366 | A | * | 7/1999 | Mori et al. ................ 29/888.43 |
| 5,931,038 | A | * | 8/1999 | Higashi ......................... 72/70 |
| 5,970,613 | A | * | 10/1999 | Mori et al. ................ 29/888.43 |
| 2003/0010201 | A1 | * | 1/2003 | Takahashi et al. .......... 92/169.1 |

FOREIGN PATENT DOCUMENTS

| EP | 0 633 327 A1 | 1/1995 |
| GB | 1 378 009 A | 12/1974 |
| GB | 2 177 120 A | 1/1987 |
| JP | 54-007012 A | 1/1979 |
| JP | 55-175006 | 12/1980 |
| JP | 56-154544 U | 11/1981 |
| JP | 62-240770 A | 10/1987 |
| JP | 2-28320 U | 2/1990 |
| JP | 03-173779 A | 7/1991 |
| JP | 10-077807 A | 3/1998 |
| JP | 10-280185 | * 10/1998 |
| JP | 11-320414 A | 11/1999 |
| JP | 2002-505959 A | 2/2002 |
| JP | 2002-155350 A | 5/2002 |
| JP | 2004-244709 A | 9/2004 |

* cited by examiner

*Primary Examiner*—Jennifer McNeil
*Assistant Examiner*—Jason L Savage
(74) *Attorney, Agent, or Firm*—Foley & Lardner LLP

(57) ABSTRACT

A prespray processing method includes preparing a work surface for spray coating, roughing the work surface by pressing a tool against the work surface, having a material of the work surface displaced thereon to form a depression thereinto, and keeping the material of the work surface unremoved therefrom.

5 Claims, 4 Drawing Sheets

PRESPRAY PROCESSING METHOD AND PRESPRAY PROCESSED ENGINE CYLINDER BLOCK

BACKGROUND OF THE INVENTION

1. Field of Invention

The present invention relates to a prespray processing method in which a base material surface is roughed prior to a spray coating process, and a prespray processed engine cylinder block.

2. Description of Related Art

As a preliminary process for a formation of a coating layer of iron-based material to be sprayed onto an inner surface of a cylinder bore of a linerless aluminum cylinder block that is advantageous for weight reduction and exhaust processing of an automobile engine, a roughing of the inner surface of the cylinder bore is needed to achieve an enhanced adhesion of the sprayed coating layer.

Japanese Patent Application. Laid-open Publication No. 11-320414 discloses a shot-blasting as a roughing method. Japanese Patent Application Laid-open Publications No. 10-77807 and No. 2002-155350 disclose a cutting as a roughing method.

SUMMARY OF THE INVENTION

However, the shot-blasting results in the powder of the abrasive material remaining on the roughed surface. The cutting results in cut chips remaining on the roughed surface.

If a spray coating is performed on the roughed surface with foreign particles such as the powder of the abrasive material of the shot-blasting or the cut chips remaining thereon, these foreign particles may remain exposed on the surface of the sprayed coating, or adhesion strength of the sprayed coating layer becomes lowered, leading to unstable formation of the sprayed coating layer and lowering reliability thereof.

An object of the present invention is to provide a prespray processing method that achieves a stable formation of a sprayed coating layer, improving the reliability thereof.

An aspect of the present invention is a prespray processing method comprising: preparing a work surface for spray coating, roughing the work surface by pressing a tool against the work surface, having a material of the work surface displaced thereon to form a depression thereinto, and keeping the material of the work surface unremoved therefrom.

Another aspect of the present invention is a prespray processed engine cylinder block comprising: a cylindrical surface prepared for spray coating and roughed with a depression formed thereinto by displacement of a material of the cylindrical surface thereon without removal of the material of the cylindrical surface therefrom.

BRIEF DESCRIPTION OF THE DRAWINGS

The invention will now be described with reference to the accompanying drawings wherein.

DETAILED DESCRIPTION OF THE PREFERRED EMBODIMENT

Figure 1A:
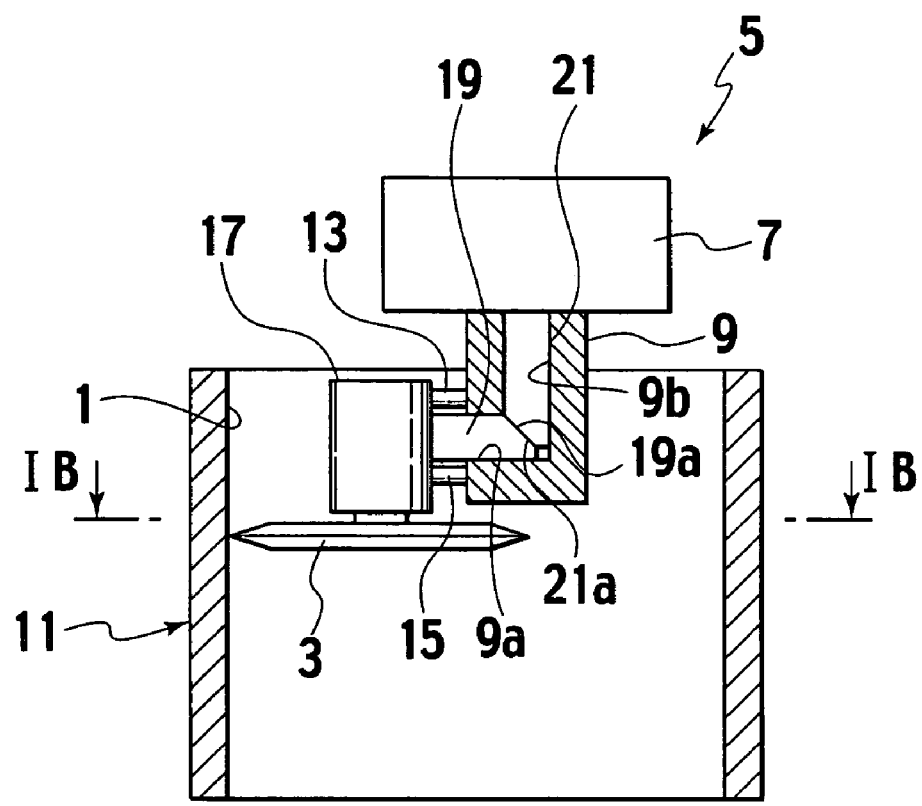
FIG. 1A is a schematic cross-sectional view showing an essential portion of a cylinder block having a cylindrical inner surface thereof being processed by a tool in a prespray processing method according to a first embodiment of the present invention and FIG. 1B is a plan view of a roller wheel of the tool for use in the method of the first embodiment taken along line IB-IB in FIG. 1A.

Embodiments of the present invention will be explained below with reference to the drawings, wherein like members are designated by like reference characters.

As shown in FIG. 1A, a cylindrical inner surface 1 such as an inner surface of a cylinder bore formed in a cylinder block of an engine is a base material surface on which a coating layer is to be formed by spray coating. A cylindrical section 11 is made of die-cast aluminum alloy (metal classification ADC12) inside of which the cylindrical inner surface 1 is provided in a processed condition with a certain precision. The cylindrical inner surface 1 is formed in a rough surface, before spray coating material composed of iron-based material is sprayed thereonto to form a sprayed coating layer.

Figure 2A:
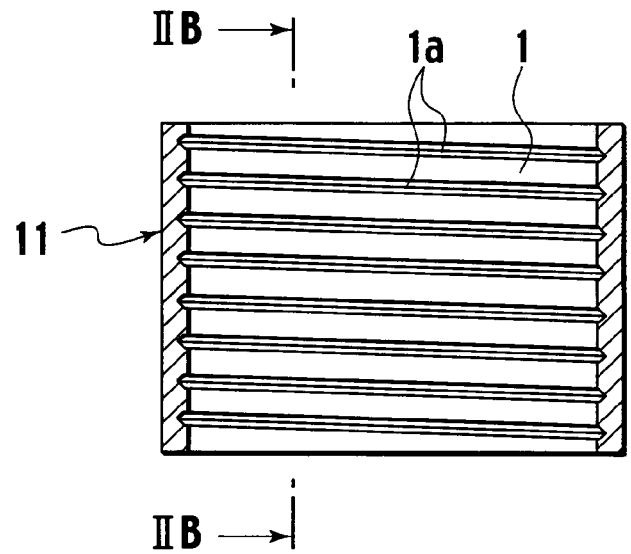
FIG. 2A is a cross-sectional view of a cylindrical section formed with a spiral groove on the cylindrical inner surface thereof and FIG. 2B is an enlarged cross-sectional view taken along line IIB-IIB in FIG. 2A.
Figure 2B:
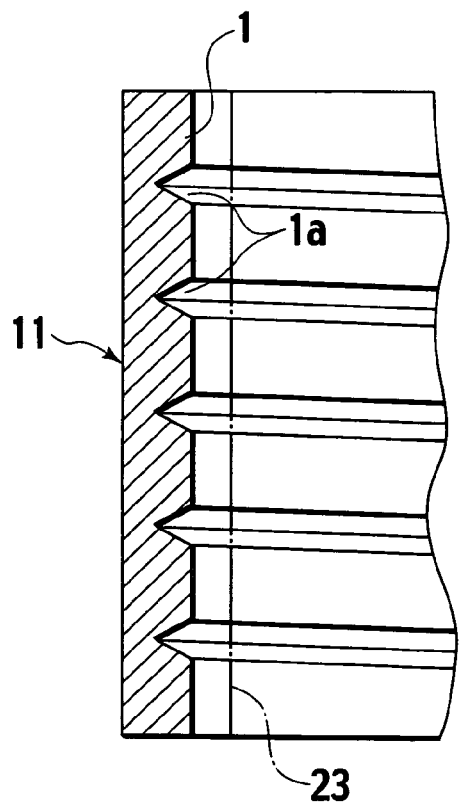

A roller wheel 3 is brought into pressure contact with the cylindrical inner surface 1, and forced to roll thereon to conduct component rolling for thereby forming a spiral groove 1a (depression) in a threaded form as shown in FIGS. 2A and 2B.

A processing device 5 supporting the roller wheel 3 thereon has a body section 7 supporting rotatably relative thereto a central shaft 9 which is to be inserted into the cylindrical section 11. The central shaft 9 has on a lower lateral side thereof a pair of guide rods 13 and 15 whose base ends are supported on the central shaft 9 movably in the radial direction of the cylindrical inner surface 1. To the distal ends of the guide rods 13 and 15, a roller wheel support shaft 17 is fixed. The roller wheel support shaft 17 has on a lower end thereof the roller wheel 13 rotatably mounted thereonto.

The roller wheel support shaft 17 has on a lateral side thereof closer to the central shaft 9, a connecting arm 19 which has one end fixed to the roller wheel support shaft 17 while the other end thereof is movably inserted into a horizontal guide hole 9a provided on the lower lateral side of the central shaft 9. The connecting arm 19 has an end portion inserted to the guide hole 9a formed with a slant face 19a that is inclined such that a lower end of the slant face 19a protrudes rightward with respect to an associated upper end as shown in FIG. 1A.

In contrast, an actuation rod 21 is inserted into a vertical guide hole 9b provided through the central shaft 9 to be movable in an axial direction thereof. The actuation rod 21 has a lower end formed with a slant face 21a held in sliding contact with the slant face 19a of the connecting arm 19.

With such a structure, the actuation rod 21 is axially moved downward by a drive mechanism (not shown) to cause the slant face 21a to slide on the slant face 19a, allowing the connecting arm 19 and the roller wheel support shaft 17 to move outward in the radial direction of the cylindrical inner surface 1 (leftward as viewed in FIG. 1A), thereby forcing the roller wheel 3 to move in the same direction to have it in pressure contact with the cylindrical inner surface 1.

Further, a resilient member such as a spring (not shown) is disposed between the central shaft 9 and the roller wheel support shaft 17 for urging the roller wheel support shaft 17 toward the central shaft 9. This allows the roller wheel 3 to be released from the cylindrical inner surface 1 in a condition where the connecting arm 19 is not pressed by the actuation rod 21.

When roughing the cylindrical inner surface 1 with the processing device 5, a whole of the processing device 5 is fed downward in the axial direction of the cylindrical inner surface 1 with the central shaft 9 being rotated about the center axis of the cylindrical inner surface 1 and the roller wheel 3 rolling on the cylindrical inner surface 1 in pressure contact therewith, whereby the spiral groove 1a is formed on the inner cylindrical surface 1 as shown in FIGS. 2A and 2B.

Component rolling is conducted with the roller wheel 3 rolling on the cylindrical inner surface 1 in pressure contact therewith to cause plastic deformation to occur on the cylindrical inner surface 1, wherein the base material on the cylindrical inner surface 1 is displaced thereon without being removed therefrom, to thereby form the spiral groove 1a thereon. This does not generate cutting chips which would be generated when roughing a surface with a generally used cutting tool, while preventing foreign particles from remaining on a roughed surface, whereby the subsequent treatment to form a sprayed coating layer (represented as at 23 in FIG. 2B) is performed in a stable condition, thereby enabling the sprayed coating layer 23 to have improved reliability.

Further, in a case that the cylinder bore inner surface of the cylinder block of the engine is a cylindrical inner surface 1 processed in the roughing process mentioned above, the cylinder bore inner surface is formed with the sprayed coating layer with high reliability, whereby defects such as biting or seizing during sliding motions of a piston can be prevented.

The prespray roughing process mentioned above is performed in the following conditions.

Material of Tool (Roller wheel 3): Sintered Hard Alloy

Rotational Speed of Central shaft 9 of Processing Device 5: 60 rpm

Feed Speed of Processing Device 5: 0.5 mm/rev

Pressing force: 100N

Further, a shape of the groove 1a resulting from the roughing process mentioned above is measured by a profile measuring tool of a non-contact type such as one using a laser, whereby precision of the shape of the groove 1a is guaranteed.

Figure 1B:
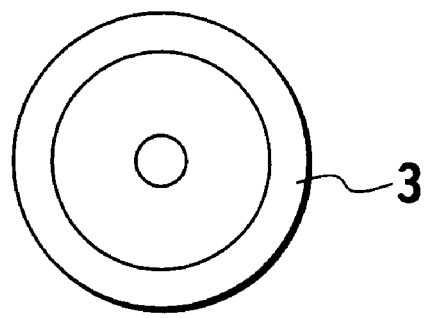
Figure 3:
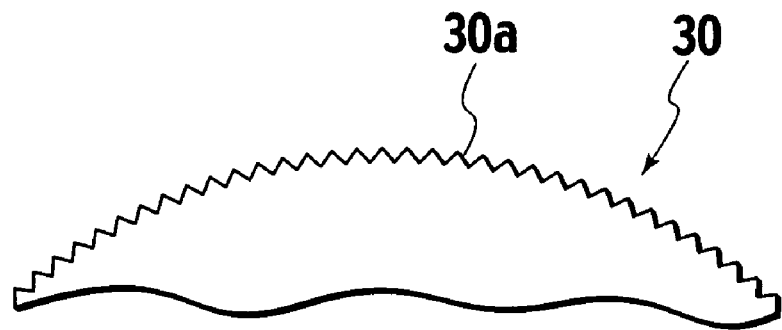
FIG. 3 is a plan view showing a part of an outer periphery of the roller wheel shown in FIG. 1A.

The roller wheel 30 in FIGS. 1A and 1B can be formed to have on its outer periphery a serrated edge 30a as shown in FIG. 3.

By having the roller wheel 30 formed with the serrated edge 30a rolling on the cylindrical inner surface 1 in pressure contact with the cylindrical inner surface 1, the cylindrical inner surface 1 is formed in a spiral groove like the spiral groove 1a as shown in FIG. 2A with a transferred pattern of the serrated edge 30a (not shown).

This allows the produced spiral groove to have a finer undulation than the spiral groove 1a in FIGS. 2A and 2B, enabling a sprayed coating layer to have further improved adhesion.

Figure 4:
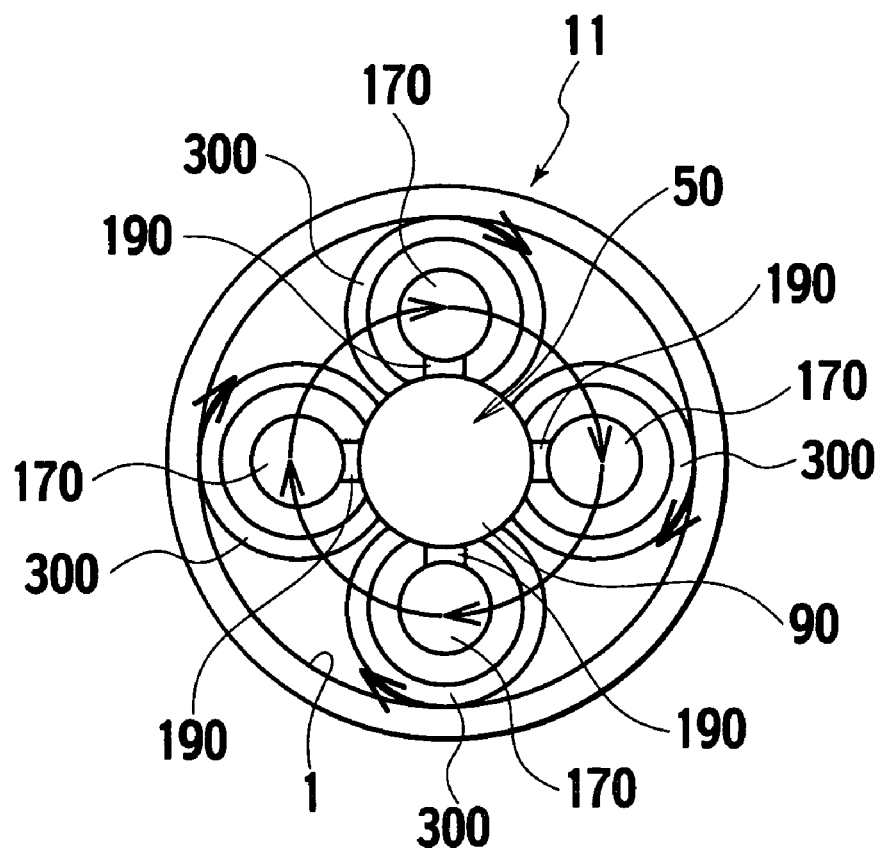
FIG. 4 is a plan view showing an essential portion of a cylinder block having a cylindrical inner surface thereof being processed by a tool in a prespray processing method according to a second embodiment of the present invention.

A second embodiment of the present invention will be explained with reference to FIG. 4. In this embodiment, a processing device 50 has a plurality of connecting arms 190 each corresponding to the connecting arm 19 of FIG. 1, and pluralities of roller wheel shafts 170 and roller wheels 300 associated with the connecting arms 190. The connecting arms 190 are connected to a central shaft 90 corresponding to the central shaft 9 of FIG. 1 at equidistantly and circumferentially spaced positions on the lower lateral side thereof.

Like the first embodiment, the connecting arms 190 are caused to move with the roller wheel support shafts 170 toward the cylindrical inner surface 1 and pressed outward in the radial direction of the cylindrical inner surface 1, such that the roller wheels 300 are brought into pressure contact with the cylindrical inner surface 1. Here, an actuation rod is formed to have a slant faces on a lower end thereof at circumferentially spaced four positions in face-to-face relationship with the connecting arms 190.

With the second embodiment, the central shaft 90 is rotated and fed in the axial direction of the cylindrical inner surface 1, with the plurality of roller wheels 300 rolling on the cylindrical inner surface 1 in pressure contact therewith to form a plurality of spiral grooves thereon. The use of the plurality of roller wheels 300 provides the spiral grooves formed in a smaller pitch than that of the first embodiment of FIG. 1. Accordingly, a sprayed coating layer can be formed in further improved adhesion than that achieved in the first embodiment.

Further, using appropriate binders, powder of nickel-based material is adhered onto the roller wheels 3, 30, 300 of the embodiments set forth above at contact areas thereof to come into contact with the cylindrical inner surface 1. The nickel-based material on the roller wheels is to be left in and adhere onto the grooves 1a when the roller wheels 3, 30, 300 roll on the cylindrical inner surface 1 in pressure contact therewith to form the groove 1a.

Nickel-based material has higher adhesion strength to iron-based material to be used as a spray coating material than aluminum-based material of which the cylindrical inner surface 1 is made. Therefore, the provision of nickel-based material adhered onto the cylindrical inner surface 1 enhances the adhesion of the sprayed coating layer thereto. Furthermore, when spray coating material is sprayed onto the cylindrical inner surface 1, powder of nickel-based material adhered onto the grooves 1a on the cylindrical inner surface 1 is caused to melt due to heat of the sprayed material, thereby providing a further increase in adhesion strength of the sprayed coating layer onto the cylindrical inner surface 1.

Figure 5:
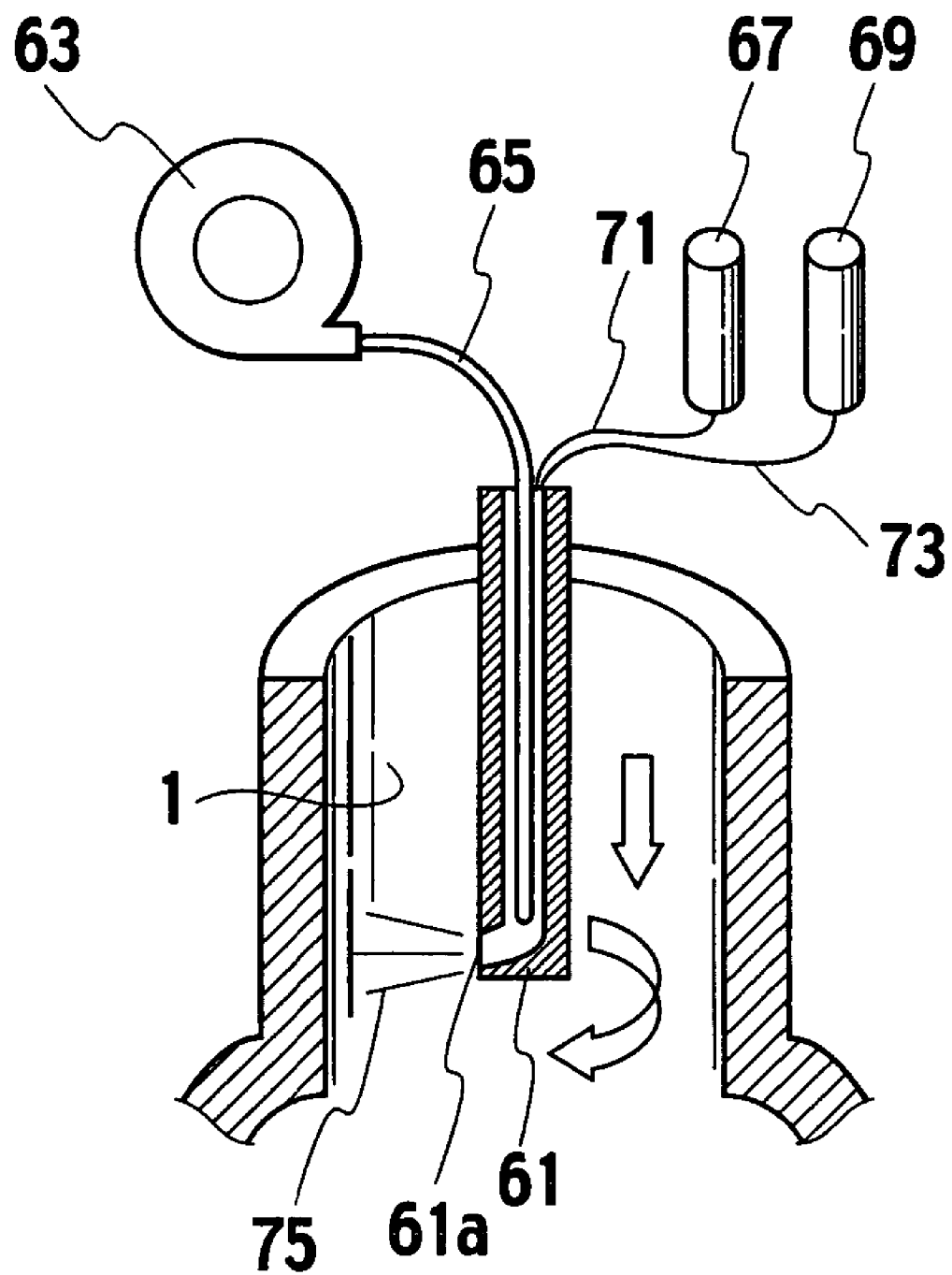
FIG. 5 is a schematic showing a spray coating to be implemented when forming a coating layer on the roughed inner surface.

FIG. 5 is a view illustrating how a spray coating is carried out for forming the sprayed coating layer 23. A wire flame spray coating gun 61 is inserted into a center of a cylinder bore. An iron-based metal is melted as spray coating material and sprayed through a spray coating port 61a onto the cylindrical inner surface 1 (inner surface of the cylinder bore), whereby the sprayed coating layer 23 is formed.

In the spray coating process, the spray coating gun 61 is supplied with a flame wire 65 of iron-based material as spray coating material from a flame wire supplier 63, fuel gas from a fuel gas container 67 storing fuel gas for ignition such as acetylene, propane or ethylene through a delivery tubing 71, and oxygen gas from oxygen gas container 69 storing oxygen gas through a delivery tubing 73. The spray coating gun 61 is further supplied with compressed air from a compressor (not shown). The compressed air is used to spray melt droplets of coating material 75 resulting from thermal melting due to ignition onto the cylindrical inner surface 1, while the spray coating gun 61 is rotated and fed in an axial direction of the cylinder bore.

The preferred embodiments described herein are illustrative and not restrictive, and the invention may be practiced or embodied in other ways without departing from the spirit or essential character thereof. For example, the base material surface is not limited to the inner surface of the cylinder bore of the cylinder block of the engine. The present invention may have application to other cylindrical inner surfaces. In a further alternative, the present invention is not limited to the cylindrical surface, and may be applied to other contoured surface profiles.

The scope of the invention being indicated by the claims, and all variations which come within the meaning of claims are intended to be embraced herein.

The present disclosure relates to subject matters contained in Japanese Patent Application No. 2004-271743, filed on Sep. 17, 2004, the disclosure of which is expressly incorporated herein by reference in its entirety.

What is claimed is:

1. A prespray processing method comprising:
   preparing a work surface for spray coating,
   roughing the work surface by pressing a tool against the work surface,
   having a material of the work surface displaced thereon to form a spiral groove thereinto, and
   keeping the material of the work surface unremoved therefrom,
   wherein the tool comprises:
      a roller wheel for rolling on the work surface,
      a roller wheel support shaft on which the roller wheel is mounted and about which the roller wheel is rotatable,
      an arm fixed to the roller wheel support shaft, the arm being moveably supported in a supporting member such that the arm is moveable toward the work surface together with the roller wheel and the roller wheel support shaft, and
      a rod extending in a direction parallel to the work surface and being moveably supported in the supporting member such that the rod is moveable in the direction parallel to the work surface, the rod having a driving face for driving the arm toward the work surface, the driving face being in direct contact with the arm, and
   wherein the rod is moved in the direction parallel to the work surface, and the driving face thereof is pressed against the arm to drive the arm toward the work surface such that the roller wheel is pressed against the work surface.

2. The prespray processing method according to claim 1, wherein the roller wheel is formed to have an edged outer periphery.

3. The prespray processing method according to claim 1, wherein the roller wheel is formed to have a serrated edge on an outer periphery thereof.

4. The prespray processing method according to claim 1, wherein the work surface comprises a cylindrical inner surface, and a plurality of sets of the roller wheel, the support shaft, and the arm are used concurrently for forming spiral grooves into the cylindrical inner surface.

5. A prespray processing method comprising:
   preparing a work surface for spray coating,
   roughing the work surface by pressing a tool against the work surface,
   having a material of the work surface displaced thereon to form a depression thereinto, and
   keeping the material of the work surface unremoved therefrom,
   wherein the work surface is a cylinder bore surface of an aluminum cylinder block, and the sprayed coating layer to be formed thereon is made of iron-based material, and
   wherein the tool carries a nickel-based material to be left in the depression when the tool is pressed against the work surface for roughing the work surface.

* * * * *